United States Patent [19]

Battarel

[11] 4,419,742

[45] Dec. 6, 1983

[54] SHIFT REGISTER FOR MAGNETIC DOMAIN PROPAGATION MEMORY

[75] Inventor: Claude Battarel, Magagnosc, France

[73] Assignee: Crouzet, Paris, France

[21] Appl. No.: 201,738

[22] Filed: Oct. 29, 1980

[30] Foreign Application Priority Data

Nov. 7, 1979 [FR] France .................................. 79 27447

[51] Int. Cl.³ ............................................. G11C 19/08
[52] U.S. Cl. ....................................... 365/87; 365/133
[58] Field of Search ......................... 365/87, 88, 8, 158

[56] References Cited

U.S. PATENT DOCUMENTS 3,997,884 12/1976 Battarel et al. ......................... 365/88
4,124,901 11/1978 Battarel ................................. 365/88
4,250,566 2/1981 Battarel ................................. 365/88

Primary Examiner—James W. Moffitt
Attorney, Agent, or Firm—Holman & Stern

[57] ABSTRACT

The register comprises a soft magnetic layer in which is formed the domain propagation channel, a hard magnetic layer and a domain shift conductor. The propagation channel comprises a writing box, a reading box, narrow domain storage zones, widened domain growth boxes, a domain increasing zone, upstream the reading box, which includes intermediate domain increasing boxes, which have a large surface with respect to that of the other growth boxes. Each increasing box comprises lateral shoulders and is not covered by the shift conductor. A coil or a solenoid creates at the level of the increasing zone and of the reading box, a pulsating external magnetic field.

15 Claims, 6 Drawing Figures

4,419,742

SHIFT REGISTER FOR MAGNETIC DOMAIN PROPAGATION MEMORY

BACKGROUND OF THE INVENTION

The present invention relates to a storage register for propagating magnetic domains in a propagation channel comprising an insulating substrate, a soft magnetic layer overlying the insulating substrate, in which is formed the propagation channel, a hard magnetic layer overlying the soft magnetic layer, except in the areas defining the propagation channel, an insulating layer overlying the soft and hard magnetic layers, a shift conduction layer in a Greek border pattern overlying the insulating layer, constituted by parallel segments perpendicular to the propagation channel, the propagation channel comprising a writing box, upstream the propagation channel, a reading box, downstream the propagation channel, narrow zones for the storage of the domains, widened boxes for the growth of the domains.

A register of this type has been described in particular in U.S. Pat. No. 4,250,566.

The present invention relates more particularly to the reading of the domains at the downstream end of the propagation channel, for example by means of reading magnetoresistor disposed on the reading box of the propagation channel.

As soon as these storage registers appeared, it was already sought to obtain a maximum reading level with, to this end, an enlarged, or widened, reading box and a register structure allowing the domains to split and, consequently, allowing this reading box to be filled with a likewise increased domain, the reading level depending on the quantity of magnetostatic charges at the downstream end of the domain.

The split of the domains into a determined number of domains, obviously along the difficult axis of the soft layer, and therefore the filling of the reading box with a plurality of domains, is already advantageous. In fact, as the time for the domains to grow perpendicularly to the propagation channel, is much longer than the time for the domains to grow by the points, i.e. in the direction of the propagation channel, the reading time, in this case, compared with that which is necessary when the reading box is filled only with one increased domain by the shift conductor, is divided by a number equal to the quantity of the split domains.

In addition, the split of the domains makes it possible not to cause the shift and increasing conductor to pass over the reading box, and consequently enables the reading magnetoresistor to be disposed on the reading box, at the same level as the shift conductor.

However, this domain split must be effected via increasing boxes. Now, the structure of heretofore known registers was such that the self erasion of these intermediate increasing boxes could not be envisaged and that either erasion conductors had to be provided or, preferably, a simple erasion conductor but with a plurality of consecutive segments in the same direction above these intermediate boxes. Even if the shift conductor served at the same time as erasion conductor, this raised a problem of topology, due to the multiple enclosure by the conductor of the output studs or terminals thereof. In any case, the increase of the domains in the intermediate increasing boxes also required a plurality of consecutive segments of the shift conductor in the same direction, to preserve the current density along the intermediate boxes. The known registers therefore raised this problem of topology.

SUMMARY OF THE INVENTION

It is an object of the invention to eliminate this problem and consequently to facilitate manufacture of the domain propagation registers.

To this end, the present invention relates to a storage register for propagating magnetic domains in a propagation channel comprising an insulating substrate, a soft magnetic layer overlying the insulating substrate, in which is formed the propagation channel, a hard magnetic layer overlying the soft magnetic layer, except in the areas defining the propagation channel, an insulating layer overlying the soft and hard magnetic layers, a shift conduction layer in a Greek border pattern overlying the insulating layer, constituted by parallel segments perpendicular to the propagation channel, the propagation channel, comprising a writing box, upstream the propagation channel, a reading box, downstream the propagation channel, narrow zones for the storage of the domains, widened boxes for the growth of the domains, and a zone, upstream and adjacent the reading box, for the growth of the domains including intermediate boxes for increasing of the domains and, there between, zones for storing the domains, characterized in that the intermediate increasing boxes of the zone adjacent the reading box have a large surface compared to that of said widened boxes and comprise at least one lateral shoulder, said intermediate increasing boxes being not covered by the shift conduction layer, and means being provided for creating, at least at the level of said reading box and said zone adjacent the reading box, a pulsating external magnetic field.

Due to the shoulder of the intermediate increasing boxes which creates therein a demagnetizing static field, the magnetic domains are erased in the time periods where the pulsating external magnetic field disappears. As to the propagation and increase of the domains in the increasing zone, it is precisely this external field which performs them, the increasing boxes not being subjected to the action of the field created by the shift conductors.

The present invention therefore makes it possible advantageously to separate the functions of propagation—increase of the domains and erasion of the domains.

Furthermore, due to the extent of the intermediate increasing boxes, the demagnetising static fields which prevail therein, whilst being sufficient to erase the domains, are, however, sufficiently weak in order not to oppose the growth of the domains, particularly in the lateral sense, under the action of the external field.

In a preferred embodiment of the register of the invention, the magnetic field creating means are arranged to create a pulsating external magnetic field on the whole register.

In this case, the invention procures an additional advantage in that, without external field, the domains do not engage completely in the narrow storage zones of the propagation channel.

With this external field, according to the invention, the domains increase and extend up to the downstream end of the storage zones. When the current in the shift conductor is annulled, the external field still remains insufficient to bring the domain in the growth boxes. The domains increase in the widened boxes only at the following alternation of the shift current. Consequently, the transitory domains of the register of the invention are longer than those of known registers, this making it possible, with comparable register structure, to obtain a greater information storage density.

The means for creating the pulsating external field may comprise a flat coil or a flattened solenoid.

BRIEF DESCRIPTION OF THE DRAWINGS

The invention will be more readily understood on reading the following description with reference to the accompanying drawings, in which.

DESCRIPTION OF PREFERRED EMBODIMENTS OF THE INVENTION

Figure 1:
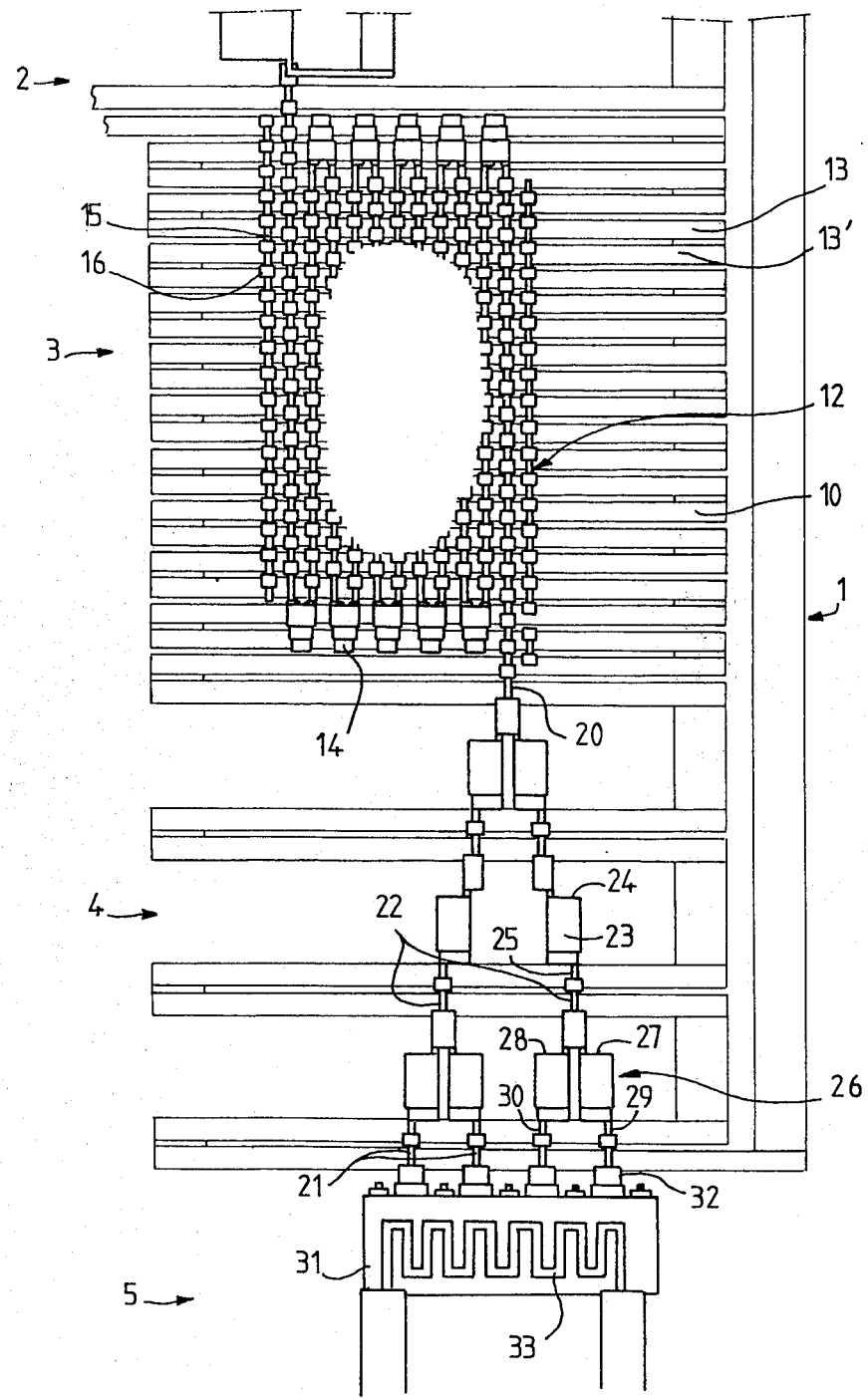
FIG. 1 is a plan view of a first embodiment of the domain propagation circuit of the register of the invention.

Referring now to the drawings, FIG. 1 shows a plan view of the domain propagation circuit in a first embodiment 1 of the storage register of the invention. The register 1 comprises four successive zones, namely a conventional domain writing zone 2, a domain propagation zone 3, a domain increasing zone 4 and a domain reading zone 5.

Figure 2:
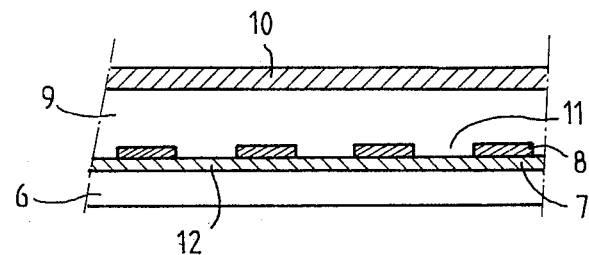
FIG. 2 is a view in section of the propagation channel of the register of FIG. 1.

FIG. 2 shows a view in section of the propagation zone 3. In this zone, the register comprises, in known manner, a monocrystalline substrate 6, or another material with specular surface, a soft magnetic layer 7 with uniaxial anisotropy overlying the substrate 6 a hard magnetic layer 8, overlying the soft layer 7, except in the areas 11 defining in the soft layer a domain propagation channel 12, an insulating layer 9 overlying the soft and hard magnetic layers, and a conduction layer 10, for shifting the domains in their propagation channel 12, and overlying the insulating layer 9. The shift conductor 10 is in a Greek border pattern and is constituted by pairs of parallel segments 13 and 13', perpendicular to the propagation channel, adapted to have a pulsating shift alternating current passing therethrough in opposite directions and disposed alongside one another in a determined pitch, which is substantially equal, in the present case, to the width of these segments. The propagation channel 12 comprises segments parallel to the uniaxial anisotropy axis of the soft magnetic layer 7 perpendicular to the segments of the shift conductor, and connected together in two's by boxes or connecting portions 14. Each segment of the propagation channel 12, between its two end connecting portions, comprises narrow zones 15 for domain storage and widened boxes 16, widened refering at least to width and preferably to both width and heigth, for domain growth between an upstream storage box and a downstream storage box, the widened boxes being disposed alternately beneath the segments 13 and 13' of the shift conductor.

In the domain increasing zone 4, the register is constituted by a structure similar to that of the propagation zone 3 with, however, the following characteristics of the invention.

The shift conductor now comprises only a few pairs of parallel segments 13, 13' spaced from one another by a given number of pitches of the conductor segments of the propagation zone 3. In the embodiment of FIG. 1, the zone 4 comprises only three pairs of conductor segments 13, 13' spaced apart in two's by a distance equal to four times the pitch of the segments of the propagation zone. The domain propagation channel, in this zone 4, is arranged to provoke the increasing and the splitting of the domains into a determined number of domains, with a view to obtaining a maximum reading level. In the example shown, four domains which will fill the reading box are obtained from one domain and after six clock periods.

The propagation channel of the zone 4 starts at a narrow domain storage zone 20 and reaches a given number n, four in the present case, of storage zones 21, disposed just upstream the reading zone 5. Between zone 20 and these zones 21, the propagation channel comprises intermediate domain increasing boxes. The channel is divided into two, a first time, at the output of the storage zone 20, each of the two segments of the channel issuing from this box 20, also being divided into two at the output of storage zones 22 located beneath the second pair of conductor segments of this zone 4. Under each pair of conductor segments there are located, in the direction of propagation, a first storage zone, beneath the first conductor segment, a widened box, which is a normal growth box similar to those of the propagation zone 3, and a second storage zone, beneath the second conductor segment. In the example shown, the storage zones 22 and 21 are said second storage zones disposed respectively beneath the second conductor segment of the second and third pairs of conductor segments.

The intermediate increasing boxes of this zone 4, generally rectangular in shape, have three particular features. In the first place, they are disposed between a second storage zone beneath a pair of conductor segments and a first storage zone beneath the following pair of conductor segments, i.e. they are not covered by the shift conductor.

In the second place, they comprise at least one lateral shoulder in the direction perpendicular to the direction of propagation. Thus have been provided single intermediate increasing boxes 23, between the first and the second pair of conductor segments, comprising one lateral shoulder 24 and, consequently, one output on one narrow storage zone 25, and double intermediate increasing boxes 26, one just upstream the first pair of conductor segments, and two between the second and third pairs of conductor segments, each comprising two lateral shoulders 27, 28 in opposite directions, and consequently two outputs on two first narrow storage zones 29, 30.

In the embodiment of FIG. 1, the shoulders 24, 27, 28 are such that the increasing boxes have small sides, perpendicular to the easy axis of the soft magnetic layer, on which are accumulated negative magnetostatic charges, on the upstream sides, and positive magnetostatic charges on the downstream sides. These charges create in the boxes 23 and 26 a demagnetizing static field.

Finally, the intermediate increasing boxes have a large surface, compared with that of the widened growth boxes of this zone and of the propagation zone 3.

Downstream and adjacent the described increasing zone 4, is located the reading zone 5, comprising a very large reading box 31, connected to the four outputs 21 of the zone 4 by four growth boxes 32, and a reading magnetoresistor 33, disposed directly on the box 31, at the same level as the shift conductor 10, the latter not passing on the reading box.

As current pulses pass through the shift conductor, in manner known per se, in order to create an "internal" magnetic field, it is provided according to the invention to superpose on this internal field a pulsating external magnetic field, parallel to the direction of domain propagation.

Figure 3:
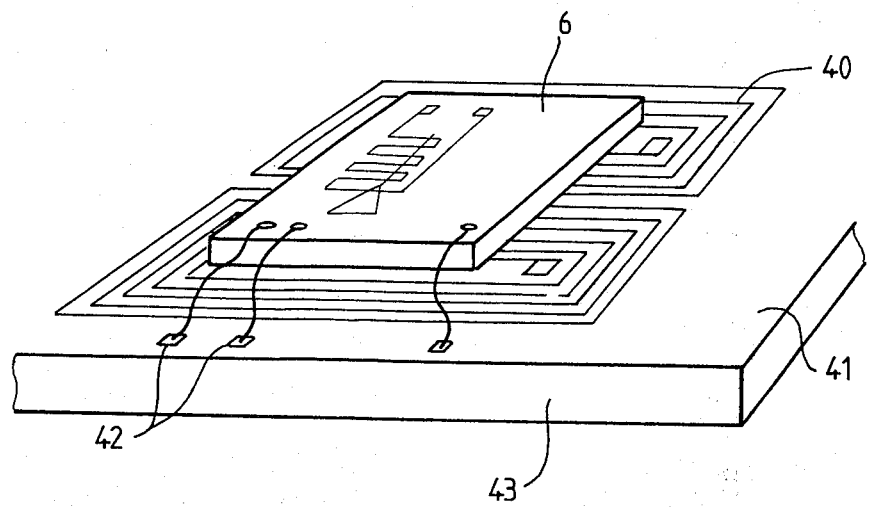
FIG. 3 is a perspective view of the register of the invention with a flat coil for creating an external field.

Thus, it has been provided, in the embodiment of FIG. 3, to create this auxiliary field by sending a pulsating current, of the same sign, into a flat coil 40, located beneath the storage substrate 6. The coil 40 is constituted by a conductor deposited on a ceramic substrate 41, on which the contact studs 42 (not shown in FIG. 1) of the conductor 10 which is deposited on the storage substrate 6, have also been deposited. The coil 40 is economical to produce, as it does not require either assembly or additional manufacturing step. The substrate 41 of the coil is disposed in a base 43.

Figure 4:
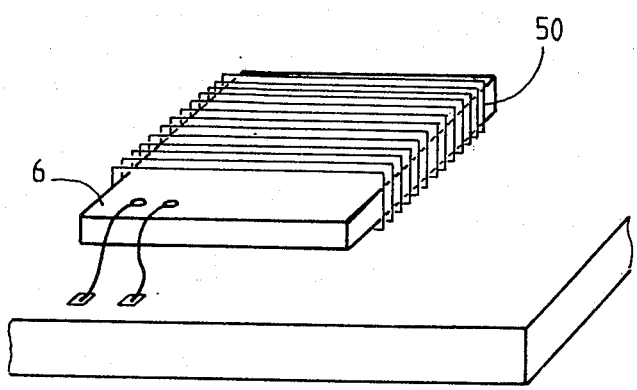
FIG. 4 is a perspective view of the register of the invention with a flattened solenoid for creating an external field.

In the embodiment of FIG. 4, the auxiliary external magnetic field is created by a small flattened solenoid 50 surrounding the storage substrate 6. This solenoid is also economical to manufacture and the connections of the studs of the storage substrate may easily and directly be passed through the two openings of the solenoid.

It has been seen hereinabove that the auxiliary external field was parallel to the direction of domain propagation. Although it is not an imperative condition, it is, however, preferable to respect this to avoid parasitic nucleations.

The register of the invention having now been described, the essential aspects of its functioning may now be considered.

As has been seen hereinabove, the shoulders 24, 27 and 28 create in the intermediate domain increasing boxes 23 and 26 a demagnetizing static field. In the time periods where the pulsating external field, created by the coil 40 or by the solenoid 50, disappears, the magnetic domains are erased therein. When this external magnetic field is not zero, it is the one which ensures, in the domain splitting zone 4, the propagation and increasing of the magnetic domains, the increasing boxes 23 and 26 not being covered by the shift conductor 10 and consequently not being subjected to the magnetic field created by this conductor.

The present invention therefore enables the functions of propagation-increase, on the one hand, and erasion, on the other hand, to be separated in the domain splitting zone. It should be noted that, due to the extent of the intermediate boxes 23 and 26, the demagnetizing static fields which prevail therein, whilst being sufficient to erase the domains, are, however, insufficient to oppose the domain growth under the action of the auxiliary field.

Due to the external magnetic field created by the coil 40, or the solenoid 50, on the whole register 1, the domains increase and extend up to the downstream end of the storage zone 15. When the current in the shift conductor 10 is annulled, the external auxiliary field remains insufficient to cause the domains to enter the growth widened boxes 16. It is only at the following alternation of the current in the conductor 10 that the domains grow in the boxes 16. Consequently, these transitory domains are very long, which enables a very considerable information storage density to be obtained.

By way of example, the coil 40, or the solenoid 50, may be made with conductors disposed in a pitch of 50 to 100 μm. With a current amplitude of 100 mA, an external auxiliary field of 12 Oersted is created. For a soft magnetic layer 7 of 1500 Å thickness made of amorphous alloy of $Ni_{50}Co_{40}P_{10}$, deposited chemically without current by the wet process, with a wall energy density of 1.7 erg/cm$^2$, a register 1 according to the invention is produced, having a density of 130,000 bits/cm$^2$. From a substantially different alloy and a smaller thickness, the density may be greater than 250,000 bits/cm$^2$. The magnetoresistor 33 is constituted by a conductor, likewise in a Greek border pattern, made of $Ni_{86}Fe_{14}$ alloy, 2000 Å thick. The reading of the box 31 is effected in 0.5 μs. During a clock period of 1 μs, a writing is effected in the zone 2 of the register 1, a reading in zone 5 and all the information contained in the register 1 shifts by one step.

The structure of the register 1, as is described hereinabove, is particularly adapted to the complete integration of a storage memory, with its access circuits (writing current generator, shift current generator or switch, reading amplifier, control logic), on a monolithic pellet of a conventional integrated circuit. This integration may be effected on a portion of silicon, corundum, etc., firstly by depositing the access circuits on this portion of semiconductor, protecting them thereafter for example by a layer of glass, then depositing the magnetic structure on the same portion, in the manner described hereinabove.

Figure 5:
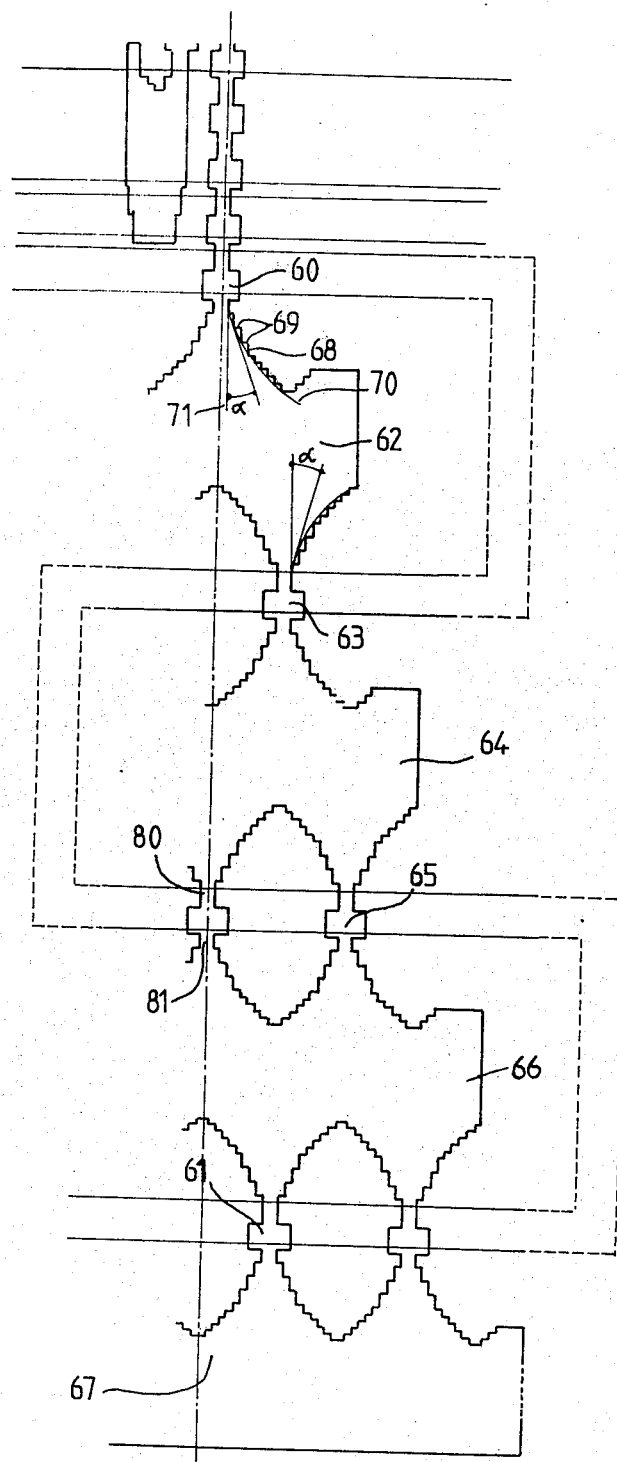
FIG. 5 is a half plan view of a second embodiment of the domain increasing zone of the register of the invention.

The embodiment of FIG. 5 of the domain increasing and splitting zone differs from that of FIG. 1. It avoids a risk and presents an additional advantage.

Firstly, the small shouldered sides of the increasing boxes 23 and 26 of the first embodiment described, on which are accumulated the magnetostatic charges, are relatively long with respect to the corresponding sides of the other growth boxes of the register. This results in a risk of nucleation of the domains, which the embodiment of FIG. 5 eliminates. In fact, the lateral shoulders of this form, instead of being perpendicular over the whole of their length to the easy axis of the soft magnetic layer, like those of FIG. 1, are generally curved and are progressively connected to a conventional widened box, upstream or downstream thereof depending on the shoulder in question, making a relatively small angle with the direction of anisotropy of the soft layer. The optimal angle of connection is close to 30°. However, for a demagnetizing field to be created in these increasing boxes, for domain erasion, it is necessary locally to form small shoulders really perpendicular to the direction of anisotropy, for magnetostatic charges to accumulate thereon.

Thus, the domain increasing zone of FIG. 5, only half of which being illustrated since the zone is symetrical about the axis represented in dotted line, starts from a conventional widened box 60 and terminates at four conventional widened boxes 61. Between these boxes, the propagation channel is divided a first time into two, at the output of the first large increasing box 62, to terminate at two conventional widened boxes 63. Downstream of the boxes 63, the propagation channel is divided a second time into three, at the output of the second large increasing box 64, to terminate at three conventional widened boxes 65. Finally, between the boxes 65 and 61, the propagation channel comprises a third large increasing box 66, with four outputs, which will fill the reading box 67.

One of the particular features of this splitting and increasing zone, as has been seen hereinabove, resides in that each lateral shoulder, for example the shoulder 68 of the box 62, is in fact constituted by a series of small shoulders 69 perpendicular to the direction of anisotropy and shifted in the direction of domain propagation, to form a progressive curve 70 making a fairly small angle $\alpha$ with the direction of anisotropy 71. Two progressive upstream shoulders and two progressive downstream shoulders are connected to each conventional widened box.

The second particular feature of the splitting zone of FIG. 5 lies in the fact that each conventional widened box 60, 63, 65 and 61 is associated, upstream, with a normal narrow storage zone 80 and, downstream, with a narrow zone 81 too short to conserve the domains, unlike the downstream narrow zones of FIG. 1. Apart from the elimination of any danger of domain nucleation, this results in the advantage of the domains no longer being blocked at the input of the large domain increasing boxes, i.e. downstream of the conventional widened boxes, and a shift conductor segment being thus eliminated, in the present case the one which, in the embodiment of FIG. 1, passed above the narrow storage zones located downstream the conventional widened boxes.

Figure 6:
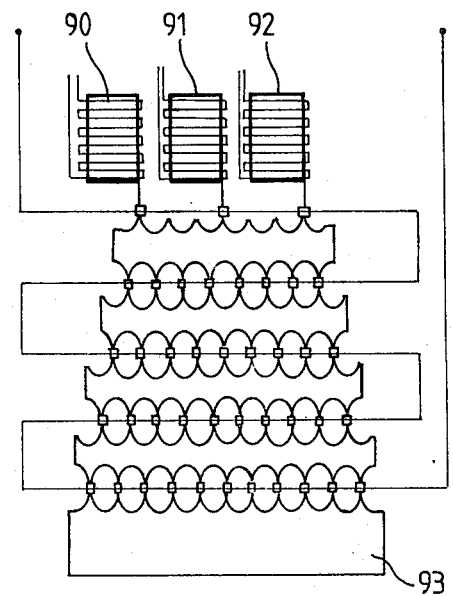
FIG. 6 is a schematic view of a plurality of registers according to the invention, integrated on the same substrate.

Due to the embodiment of the splitting and increasing zone of FIG. 5, it is quite possible, according to the diagram of FIG. 6, to integrate a plurality of registers 90, 91, 92, for example, on a same substrate, by imbricating their splitting and increasing zones in one another, and by forming only one reading zone, with one reading box 93 only, and consequently one reading magnetoresistor only. This integration leads to a considerable saving of space. A 64 k memory with 16 4 k registers may thus be produced, or a 256 k memory, with 32 8 k registers.

I claim:

1. A storage register for propagating magnetic domains in a propagation channel comprising an insulating substrate, a soft magnetic layer overlying the insulating substrate, in which is formed the propagation channel, a hard magnetic layer overlying the soft magnetic layer, except in the areas defining the propagation channel, an insulating layer overlying the soft and hard magnetic layers, a shift conduction layer in a Greek border pattern overlying the insulating layer, constituted by parallel segments perpendicular to the propagation channel, the propagation channel, comprising a writing box, upstream the propagation channel, a reading box, downstream the propagation channel, narrow zones for the storage of the domains, widened boxes for the growth of the domains, and a zone, upstream and adjacent the reading box, for the growth of the domains including intermediate boxes for increasing of the domains and, there between, zones for storing the domains, characterized in that the intermediate increasing boxes of the zone adjacent the reading box have a large surface compared to that of said widened boxes and comprise at least one lateral shoulder, said intermediate increasing boxes being not covered by the shift conduction layer, and means being provided for creating, at least at the level of said reading box and said zone adjacent the reading box, a pulsating external magnetic field.

2. The register according to claim 1 wherein said means comprise a flat coil located beneath the substrate of the register.

3. The register according to claim 1 wherein said means comprise a flattened solenoid surrounding the substrate of the register.

4. Register according to claim 1, wherein the domain increasing zone (4) is covered by at least one pair of segments of the shift conductor, through which the shift current passes in opposite directions respectively, said domain increasing zone comprising two narrow domain storage zones (25, 22) disposed beneath the first and second segments of the shift conductor, respectively.

5. The register according to claim 4, wherein the increasing boxes of the increasing zone are generally rectangular in form and have sides perpendicular to the axis of uniaxial anisotropy of the soft layer with a relatively long length with respect to that of the corresponding sides of the other growth boxes of the register.

6. The register according to claim 1 wherein the external magnetic field is parallel to the direction of domain propagation.

7. The register according to claim 6, wherein said means comprise a flat coil located beneath the substrate of the register.

8. A register according to claim 6, wherein said means comprise a flattened solenoid surrounding the substrate of the register.

9. The register according to claim 1, wherein the increasing boxes are provided with generally curved lateral shoulders progressively connected to a normal growth box making a relatively small angle with the direction of uniaxial anisotropy of the soft magnetic layer.

10. The register according to claim 9, wherein the angle of connection of the lateral shoulders of the increasing boxes with the direction of uniaxial anisotropy is close to 30°.

11. The register according to claims 9 or 10, wherein the lateral shoulders are constituted by a series of small shoulders perpendicular to the direction of uniaxial anisotropy and shifted in the direction of domain propagation.

12. The register according to claims 9 or 10, wherein the normal growth boxes of the domain increasing zone is associated, upstream, with a narrow domain storage zone and, downstream, with a narrow zone too short to store the domains, only the narrow storage zone being covered by a segment of the shift conductor.

13. The register according to claim 11, wherein the normal growth boxes of the domain increasing zone is associated, upstream, with a narrow domain storage zone and, downstream, with a narrow zone too short to store the domains, only the narrow storage zone being covered by a segment of the shift conductor.

14. The register according to claim 1, wherein said means are arranged to create a pulsating external magnetic field over the whole of the register.

15. A magnetic domain propagation memory comprising a plurality of the registers according to claims 9 or 14, integrated on a same substrate and having a common reading box.

* * * * *